(12) United States Patent
Fujikura et al.

(10) Patent No.: US 12,002,903 B2
(45) Date of Patent: Jun. 4, 2024

(54) GROUP-III NITRIDE LAMINATED SUBSTRATE AND SEMICONDUCTOR ELEMENT

(71) Applicant: SUMITOMO CHEMICAL COMPANY, LIMITED, Tokyo (JP)

(72) Inventors: Hajime Fujikura, Hitachi (JP); Taichiro Konno, Hitachi (JP); Takeshi Kimura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 394 days.

(21) Appl. No.: 16/952,665

(22) Filed: Nov. 19, 2020

(65) Prior Publication Data

US 2021/0184080 A1    Jun. 17, 2021

(30) Foreign Application Priority Data

Nov. 22, 2019  (JP) ................................. 2019-211370

(51) Int. Cl.
*H01L 33/32*  (2010.01)
(52) U.S. Cl.
CPC .................................. *H01L 33/325* (2013.01)
(58) Field of Classification Search
CPC . H01L 33/325; H01L 29/2003; H01L 29/207; H01L 29/7786; H01L 21/0242; H01L 21/02433; H01L 21/02587; H01L 21/0262; H01L 21/02458; H01L 21/0254; H01L 33/32; H01L 33/007; H01L 33/06; H01L 33/145; H01L 33/02; H01L 33/12; H01L 33/16; H01L 33/18; H01L 33/30; H01L 33/0083–0091
See application file for complete search history.

(56) References Cited

U.S. PATENT DOCUMENTS

| | | | |
|---|---|---|---|
| 2005/0227453 A1 | 10/2005 | Miki et al. | |
| 2013/0001644 A1* | 1/2013 | Fujikura | H01L 29/205 257/190 |
| 2013/0009130 A1* | 1/2013 | Chen | H01L 33/32 257/15 |
| 2013/0247817 A1 | 9/2013 | Konno et al. | |
| 2018/0158680 A1 | 6/2018 | Fujikura et al. | |
| 2018/0240902 A1* | 8/2018 | Odnoblyudov | H01L 29/66462 |
| 2018/0323767 A1* | 11/2018 | Then | H03H 9/173 |

FOREIGN PATENT DOCUMENTS

| | | |
|---|---|---|
| JP | 2003-243302 A | 8/2003 |
| JP | 2005-225693 A | 8/2005 |
| JP | 2013-225648 A | 10/2013 |
| JP | 2018-093112 A | 6/2018 |

\* cited by examiner

*Primary Examiner* — Mohammad A Rahman
(74) *Attorney, Agent, or Firm* — Foley & Lardner LLP

(57) ABSTRACT

Provided is a technology capable of improving the quality of a GaN layer that is formed on an underlying substrate. A group III-nitride laminated substrate includes an underlying substrate, a first layer that is formed on the underlying substrate and is made of aluminum nitride, and a second layer that is formed on the first layer and is made of gallium nitride. The second layer has a thickness of 10 µm or less. A half-value width of (0002) diffraction determined through X-ray rocking curve analysis is 100 seconds or less, and a half-value width of (10-12) diffraction determined through X-ray rocking curve analysis is 200 seconds or less.

13 Claims, 7 Drawing Sheets

GROUP-III NITRIDE LAMINATED SUBSTRATE AND SEMICONDUCTOR ELEMENT

BACKGROUND

Technical Field

The present invention relates to a group III-nitride laminated substrate, and a semiconductor element.

Description of Related Art

A group III-nitride laminated substrate (also referred to as a "wafer" hereinafter) obtained by forming a GaN layer on an underlying substrate constituted by a substrate made of a different type of material such as a sapphire substrate is used as a material for manufacturing a semiconductor element such as a light-emitting diode (LED) (see Patent Document 1, for example). Influences due to a decrease in the precision of lithography caused by warping of a wafer are increasing, for example, due to further increases in the diameter of the wafer and further decreases in the size of a semiconductor element.

It is conceivable to reduce the thickness of a GaN layer formed on an underlying substrate in order to reduce warping of a wafer, for example. However, there is a concern that the quality of the GaN layer (e.g., crystallizability) will deteriorate due to the reduction in the thickness of the GaN layer. Therefore, a technology capable of forming a GaN layer that is of high quality despite its small thickness is in demand.

PATENT DOCUMENTS

Patent Document 1: JP 2013-225648A

SUMMARY OF INVENTION

Technical Problem

It is an object of the present invention to provide a technology capable of improving the quality of a GaN layer that is formed on an underlying substrate.

Solution to Problem

An aspect of the present invention provides a group III-nitride laminated substrate including:
  an underlying substrate;
  a first layer that is formed on the underlying substrate and is made of aluminum nitride; and
  a second layer that is formed on the first layer and is made of gallium nitride,
  wherein the second layer has a thickness of 10 μm or less, a half-value width of (0002) diffraction determined through X-ray rocking curve analysis is 100 seconds or less, and a half-value width of (10-12) diffraction determined through X-ray rocking curve analysis is 200 seconds or less.

Another aspect of the present invention provides a semiconductor element including
  the second layer included in the group III-nitride laminated substrate according to the above-mentioned aspect as at least a portion of an operating layer.

Yet another aspect of the present invention provides a group III-nitride laminated substrate including:
  an underlying substrate; and
  a first layer that is formed on the underlying substrate and is made of aluminum nitride,
  wherein a surface of the first layer is to be used as a base for growth of a second layer that is made of gallium nitride and has a thickness of 10 μm or less and in which a half-value width of (0002) diffraction determined through X-ray rocking curve analysis is 100 seconds or less, and a half-value width of (10-12) diffraction determined through X-ray rocking curve analysis is 200 seconds or less.

Advantageous Effects of Invention

Provided is a technology capable of improving the quality of a GaN layer that is formed on an underlying substrate.

DESCRIPTION OF EMBODIMENTS

First Embodiment

Figure 1:
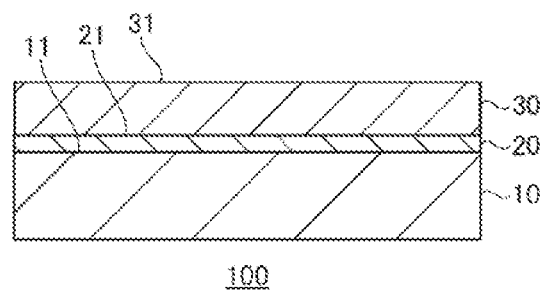
FIG. 1 is an illustrative schematic cross-sectional view of a wafer according to a first embodiment of the present invention.

A group III-nitride laminated substrate 100 (also referred to as a "wafer 100" hereinafter) according to a first embodiment of the present invention will be described. FIG. 1 is an illustrative schematic cross-sectional view of the wafer 100. The wafer 100 includes an underlying substrate 10, an AlN layer 20 made of aluminum nitride (AlN), and a GaN layer 30 made of gallium nitride (GaN). As described in detail below, one of the features of the wafer 100 according to this embodiment is that the GaN layer 30 grown directly on the AlN layer 20 is of high quality despite its small thickness.

In this embodiment, a preferable example of the underlying substrate 10 is a sapphire substrate. A sapphire substrate including a principal surface 11 that is a surface inclined to the C surface at an angle of 0.1° or more and 0.6° or less in the a axis direction or the m axis direction is preferably used as the sapphire substrate. It should be noted that the sapphire substrate may be a flat substrate that is not a patterned sapphire substrate (PSS) and has a flat principal surface 11.

In order to improve the productivity when manufacturing semiconductor elements using the wafer 100, it is preferable to use an underlying substrate 10 having a large area with which many semiconductor elements can be formed on its surface. The diameter of a sapphire substrate used as the underlying substrate 10 is preferably 2 inches (50.8 mm) or more, more preferably 4 inches (100 mm) or more, and even more preferably 6 inches (150 mm) or more. The thickness of the sapphire substrate having a diameter of 2 inches is 300 μm or more and 500 μm or less (typically 430 μm), for example, the thickness of the sapphire substrate having a diameter of 4 inches is 600 μm or more and 1000 μm or less (typically 900 μm), for example, and the thickness of the sapphire substrate having a diameter of 6 inches is 1000 μm or more and 1500 μm or less (typically 1300 μm), for example.

The AlN layer 20 is formed on the underlying substrate 10. More specifically, the AlN layer 20 is formed by being heteroepitaxially grown on the principal surface 11 of the underlying substrate 10 (directly on the principal surface 11 so as to be in contact with the principal surface 11). The AlN layer 20 functions as a nucleation layer for growing the GaN layer 30.

In order to improve the crystallizability of the AlN layer 20, the thickness of the AlN layer 20 is preferably 0.1 μm or more. Also, the thickness of the AlN layer 20 is preferably 10 μm or less in order to suppress the generation of cracks in the AlN layer 20, and more preferably 1 μm or less in order to reduce warping of the wafer 100.

Specifically, it is preferable that the AlN layer 20 has high crystallizability as described below. The half-value width of the X-ray rocking curve of the (0002) face of the AlN layer 20 is preferably 100 seconds or less, and the half-value width of the X-ray rocking curve of the (10-12) face of the AlN layer 20 is preferably 300 seconds or less. A surface 21 of the AlN layer 20 preferably has Al-polarity. It should be noted that, in this specification, the term "half-value width" means the full width at half maximum (FWHM).

The GaN layer 30 is formed on the AlN layer 20. More specifically, the GaN layer 30 is formed by being heteroepitaxially grown on the surface 21 of the AlN layer 20 (directly on the surface 21 so as to be in contact with the surface 21). That is, the GaN layer 30 is formed on the underlying substrate 10 via the AlN layer 20. The GaN layer 30 according to this embodiment is of high quality as described below.

Crystallizability of GaN Layer

The GaN layer 30 has high crystallizability. Specifically, the thickness of the GaN layer 30 is 10 μm or less, the half-value width of the (0002) face thereof determined through the X-ray rocking curve analysis is 100 seconds or less, and the half-value width of the (10-12) face thereof determined through the X-ray rocking curve analysis is 200 seconds or less.

Conventionally, when a GaN layer having improved crystallizability is formed on a sapphire substrate via an AlN layer, a GaN layer is grown to have a large thickness of about 10 μm or more, for example. The reason for this is that the thicker a grown GaN layer is, the higher the crystallizability of the GaN layer is. However, in a case where a GaN layer is formed using a common method, even if the GaN layer has a large thickness of 10 μm, the half-value width of the X-ray rocking curve of the (0002) face of the GaN layer is only reduced to about 200 seconds, and the half-value width of the X-ray rocking curve of the (10-12) face of the GaN layer is only reduced to about 300 seconds (see FIG. 12).

Figure 7:
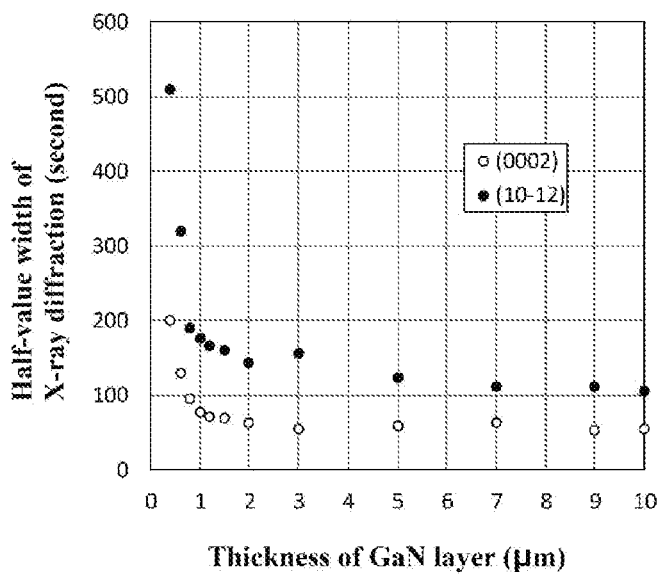
FIG. 7 is a graph showing the crystallizability of GaN layers according to a working example.

On the other hand, although the GaN layer 30 according to this embodiment has a thickness of 10 μm or less, it has high crystallizability as defined by the half-value width of the X-ray rocking curve of the (0002) face thereof being 100 seconds or less, and the half-value width of the X-ray rocking curve of the (10-12) face thereof being 200 seconds or less (see FIG. 7).

It should be noted that the crystallizability of the GaN layer 30 is likely to decrease as the thickness of the GaN layer 30 decreases, that is, the crystallizability of the GaN layer 30 is likely to increase as the thickness of the GaN layer 30 increases. Increasing the thickness of the GaN layer 30 to 0.8 μm or more makes it possible to reduce the half-value width of the (0002) face thereof to 100 seconds or less and the half-value width of the (10-12) face thereof to 200 seconds or less (see FIG. 7). Increasing the thickness of the GaN layer 30 to 1 μm or more makes it possible to reduce the half-value width of the (0002) face thereof to 80 seconds or less and the half-value width of the (10-12) face thereof to 180 seconds or less. Moreover, increasing the thickness of the GaN layer 30 to 1.5 μm or more makes it possible to reduce the half-value width of the (0002) face thereof to 70 seconds or less and the half-value width of the (10-12) face thereof to 170 seconds or less.

Surface Flatness of GaN Layer

The GaN layer 30 has high surface flatness. Specifically, when a root mean square (rms) value determined through measurement of a 5-μm square region using an atomic force microscope (AFM) is taken as surface roughness, the surface 31 of the GaN layer 30 preferably has a surface roughness of 0.5 nm or less, and more preferably has a surface roughness of 0.4 nm or less (see FIG. 8).

It should be noted that the surface flatness of the GaN layer 30 is likely to rapidly deteriorate when the GaN layer 30 has an excessively small thickness. Setting the thickness of the GaN layer 30 to 0.8 μm or more makes it possible to achieve high surface flatness as described above (see FIG. 8).

In-Plane Uniformity of Thickness of GaN Layer

The GaN layer 30 has high in-plane thickness uniformity. Specifically, when the GaN layer 30 has a thickness of 10 μm or less, the in-plane fluctuation in the thickness of the GaN layer 30 is 4% or less (see FIG. 9). The in-plane fluctuation in the thickness of the GaN layer 30 is defined as follows. A lattice of squares arranged at regular intervals (preferably, at intervals of 1 mm or more and 2 mm or less) is set on the surface of a measurement-target wafer, and the thickness of the GaN layer 30 is measured at every lattice point. As a method for measuring the thickness of the GaN layer 30 at each point, it is preferable to use a method in which a cross section is observed using an electron microscope or the like, a spectroscopic ellipsometry, or the like. It should be noted that, in many cases, correct measurement results are not obtained due to the influence of the beveled shape of the end of the wafer, the influence of irregular reflection of light, and the like. In such cases, it is preferable not to use, in the following calculation, measurement data obtained from measurement points arranged between the end of the wafer and a position about 1 to 3 mm away from the edge of the wafer. In this specification, the intervals between the lattice points are set to 1 mm, an average value and a standard deviation are determined using thickness measurement data excluding measurement data obtained from the region between the outer periphery of a wafer and a position 2 mm away from the outer periphery of the wafer, and a value (%) obtained by dividing the standard deviation by the average value is taken as the in-plane fluctuation in the thickness.

In-Plane Uniformity of Dopant Concentration in GaN Layer

When doped with a dopant, the GaN layer 30 has high in-plane dopant concentration uniformity. Specifically, when the GaN layer 30 has a thickness of 10 µm or less, the in-plane fluctuation in the dopant concentration in the GaN layer 30 is 4% or less (see FIG. 10). In response to this, when the GaN layer 30 is doped with a dopant such as an n-type dopant for controlling the carrier concentration, the in-plane fluctuation in the carrier concentration can be reduced to 4% or less (see FIG. 10).

The in-plane fluctuation in the dopant concentration and the in-plane fluctuation in the carrier concentration in the GaN layer 30 are defined as follows. Secondary ion mass spectrometry (SIMS) is commonly used to measure the dopant concentration. Capacitance-voltage measurement (CV measurement), Hall measurement, and the like are commonly used to measure the carrier concentration. The dopant concentration and the carrier concentration are measured on coordinate axes set as orthogonal coordinate axes that are located on the surface of a measurement-target wafer and pass through the center of the wafer. It is preferable that one axis of the orthogonal coordinates extends in the same direction as the off-direction of the wafer. In this specification, an average value and a standard deviation are determined using SIMS measurement data obtained from positions located on the orthogonal coordinate axes at intervals of 1 cm, and a value (%) obtained by dividing the standard deviation by the average value is taken as the in-plane fluctuation in the dopant concentration. Moreover, an average value and a standard deviation are determined using CV measurement data or Hall measurement data obtained from positions located on the orthogonal coordinate axes at intervals of 1 cm, and a value (%) obtained by dividing the standard deviation by the average value is taken as the in-plane fluctuation in the carrier concentration. As in the case of the thickness measurement described above, when some measurement points are arranged between the outer periphery of a wafer and a position 2 mm away from the outer periphery of the wafer in the measurements of the dopant concentration and the carrier concentration, measurement data obtained from such measurement points is also not used in the calculation mentioned above. It should be noted that, although the methods have been described in which the fluctuation in the dopant concentration and the fluctuation in the carrier concentration are respectively determined by directly measuring the dopant concentration and the carrier concentration, when a dopant (conductive dopant) for controlling the carrier concentration is added, the fluctuation in the carrier concentration may be estimated from the fluctuation in the dopant concentration, or, conversely, the fluctuation in the dopant concentration may be estimated from the fluctuation in the carrier concentration.

As described above, the GaIe layer 30 according to this embodiment has (at least one of, preferably two or more of, more preferably three or more of, and even more preferably all four of) high crystallizability, high surface flatness, high in-plane thickness uniformity, and high in-plane dopant concentration (carrier concentration) uniformity, and thus is of high quality.

Warping of Wafer

The wafer 100 warps due to a difference between the thermal expansion coefficients of the underlying substrate 10 (a sapphire substrate in this example) and the GaN layer 30 and the like stacked on the underlying substrate 10. The larger the thickness of the GaN layer 30 is, the more significantly warped the wafer 100 is. In order to suppress defects such as a decrease in precision of lithography caused by warping when many semiconductor elements are manufactured on the wafer 100, it is preferable that the wafer 100 is not excessively warped.

Figure 11:
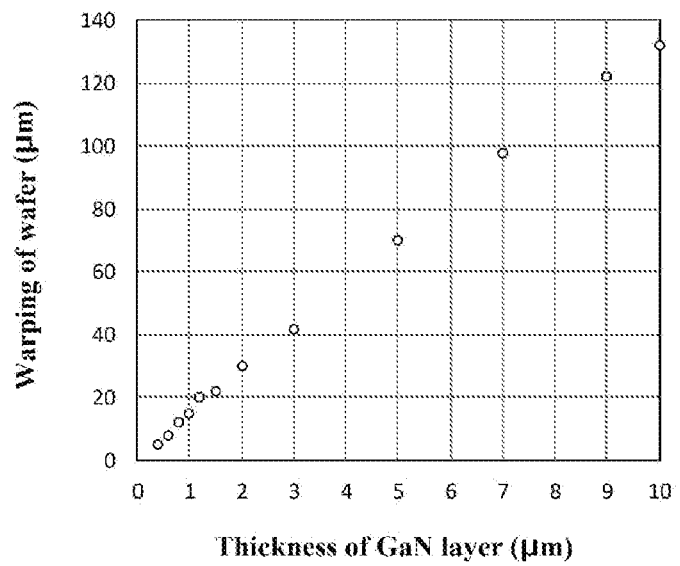
FIG. 11 is a graph showing warping of wafers including a GaN layer according to the working example.

With the wafer 100 according to this embodiment, the thickness of the GaN layer 30 is reduced to 10 µm or less, thus making it possible to reduce the warping of the wafer 100 to 140 µm or less (see FIG. 11). It is preferable to select the diameter and the thickness of the underlying substrate 10 as appropriate such that the warping is suppressed as described above. When a sapphire substrate is used as the underlying substrate 10, examples of the diameter and the thickness thereof include the values as described above.

The warping of the wafer 100 is defined as follows. A measurement-target wafer is placed on a flat surface plate or stage, and a distance (height) from the surface of the surface plate or stage to the surface of the wafer is measured. Orthogonal coordinates passing through the center of the wafer are set on the surface of the wafer, and the measurement is performed on this coordinate axes. It is preferable that one axis of the orthogonal coordinates extends in the same direction as the off-direction of the wafer. In this specification, the above-mentioned height is measured at positions located at intervals of 1 mm on the orthogonal coordinate axes. As in the case of the thickness measurement described above, when some measurement points are arranged between the outer periphery of a wafer and a position 2 mm away from the outer periphery of the wafer, measurement data obtained from such measurement points is not used in the calculation below A straight line passing through two points of the outermost periphery on each axis is taken as a new reference line, and a distance between the reference line and a measurement point that is located on the axis and is the farthest from the reference line is defined as warping for this axis. This measurement is performed for the two orthogonal axes, and an average value of the values obtained from warping for the two axes is taken as the warping of the wafer.

Next, a method for manufacturing the wafer 100 will be described. In the first embodiment, as an example, an aspect is shown in which the wafer 100 is manufactured as a GaN template including the GaN layer 30 on the outermost surface and then semiconductor elements are manufactured using the wafer (GaN template) 100.

Figure 2:
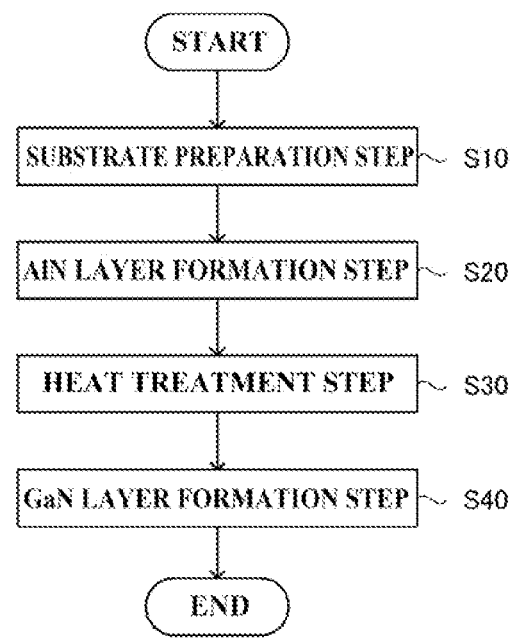
FIG. 2 is a flowchart showing an example of a method for manufacturing a wafer according to the first embodiment.

FIG. 2 is a flowchart showing an example of a method for manufacturing the wafer 100 according to the first embodiment. The manufacturing method of this example includes a substrate preparation step S10, an AlN layer formation step S20, a heat treatment step S30, and a GaN layer formation step S40.

First, the underlying substrate 10 is prepared in the substrate preparation step S10. It is preferable to use a sapphire substrate as the underlying substrate 10. Next, in the AlN layer formation step S20, the AlN layer 20 is formed on the principal surface 11 of the underlying substrate 10 by growing AlN thereon. Hydride vapor phase epitaxy (HVPE) is used as a method for growing the AlN layer 20, for example. Aluminum monochloride (AlCl) gas or aluminum trichloride (AlCl$_3$) gas is used as an aluminum (Al) source gas, for example. Ammonia (NH$_3$) gas is used as a nitrogen (N) source gas, for example. These source gases may be mixed with a carrier gas using hydrogen gas (H$_2$ gas), nitrogen gas (N$_2$ gas), or a mixed gas thereof, and then be supplied.

The following are examples of conditions for the growth of the AlN layer 20. It should be noted that the V/III ratio refers to a ratio of the supply amount of a group V (N) source gas to the supply amount of a group III (Al) source gas.

Growth temperature: 900 to 300° C.
V/III ratio: 0.2 to 200
Growth speed: 0.5 to 3000 nm/minute Hydrogen chloride (HCl) gas may be allowed to flow in order to prevent AlN from attaching to a nozzle of a gas supply pipe for introducing various gasses to a growth chamber of an HVPE apparatus. An example of the supply amount of HCl gas is such an amount that a ratio of HCl gas to AlCl gas or AlCl$_3$ gas is 0.1 to 100.

In the AlN layer formation step S20, the AlN layer 20 having high crystallizability as described above can be obtained by controlling the conditions for crystal growth, performing annealing treatment, and so on. Specifically, the crystallizability of the AlN layer 20 can be improved by suitably adjusting the growth conditions (e.g., the temperature, the growth speed, the supply amount of the raw material, and the like) for the growth of the AlN layer 20, for example. Also, the crystallizability of the AlN layer 20 can be improved by performing annealing treatment in an atmosphere containing N$_2$ gas at a temperature of 1400° C. or higher and 1700° C. or lower after growing the AlN layer 20, for example.

It should be noted that, although the crystallizability of the AlN layer 20 can be improved as described above, compressive strain caused by differences in the lattice constant and the thermal expansion coefficient from the underlying substrate 10 (a sapphire substrate in this example) is likely to be introduced to the formed AlN layer 20 in a direction parallel to the surface 21 (e.g., α axis direction).

Next, in the heat treatment step S30, heat treatment is performed on the AlN layer 20. The heat treatment step S30 is performed in an atmosphere containing H$_2$ gas (referred to as an "atmosphere containing hydrogen" hereinafter). H$_2$ gas may be mixed with an inert gas such as N$_2$ gas or argon gas (Ar gas) and then be supplied. The heat treatment may be performed in the growth chamber of the HVPE apparatus or in a separate heat treatment apparatus.

Performing the heat treatment in an atmosphere containing hydrogen makes it possible to reform the surface 21 such that the compressive strain introduced to the surface 21 of the AlN layer 20 is mitigated. Although a mechanism to mitigate the compressive strain is not clear at present, a mechanism is conceivable in which the generation of point defects in the AlN crystal is promoted in the heat treatment step S30 due to the presence of hydrogen gas in the atmosphere. It is conceivable that nitrogen atoms in AlN are linked to hydrogen on the surface of the AlN to produce ammonia and then leave therefrom, and thus many consumed nitrogen-derived pores that can serve as atom-sized voids are formed in the AlN, thus making it possible to mitigate strain of the GaN layer 30 grown on the AlN layer 20.

The heat treatment step S30 is started in a substantially ammonia-free atmosphere. Specifically, the heat treatment step S30 is performed without supplying NH$_3$ gas, for example. If the heat treatment is performed in an atmosphere containing ammonia, the above-described formation of point defects (consumed nitrogen-derived pores) will be suppressed, thus making it difficult to mitigate strain of the GaN layer 30. When the heat treatment is performed in the growth chamber of the HVPE apparatus, there is the possibility of NH$_3$ gas introduced in the AlN layer formation step S20 remaining in the growth chamber, and therefore, it is preferable to discharge (or replace) the gas in the growth chamber before performing the heat treatment. It should be noted that the term "substantially ammonia-free" as used herein means that the partial pressure of NH$_3$ gas in the growth chamber is less than 1% of the total pressure, for example. It should be noted that, although it is conceivable that nitrogen atoms in the AlN are linked to hydrogen on the surface of the AlN to produce ammonia and then leave therefrom in the heat treatment step S30 as described above, the amount of produced free ammonia is very small. Therefore, such ammonia does not cause the partial pressure of NH$_3$ gas in the growth chamber to be 1% or more of the total pressure. Accordingly, the heat treatment step S30 is performed in a substantially ammonia-free atmosphere.

It is preferable to perform the heat treatment step S30 at a temperature (also referred to as a "heat treatment temperature" hereinafter) of 900° C. or higher and 1300° C. or lower, for example. The surface 21 is difficult to reform at a heat treatment temperature of lower than 900° C. On the contrary, setting the heat treatment temperature to 900° C. or higher makes it easy to reform the surface 21. On the other hand, the surface 21 may decompose at a heat temperature of higher than 1300° C. On the contrary, setting the heat treatment temperature to 1300° C. or lower makes it possible to suppress decomposition of the surface 21.

It is preferable to perform the heat treatment step S30 for 10 minutes or more and 120 minutes or less (this time is also referred to as a "heat treatment time" hereinafter), for example. If the heat treatment time is less than 10 minutes, the surface 21 will be difficult to reform. On the contrary, setting the heat treatment time to 10 minutes or more makes it easy to reform the surface 21. On the other hand, if the heat treatment time is more than 120 minutes, the flatness of the surface 21 may be impaired. On the contrary, setting the heat treatment time to 120 minutes or less makes it possible to suppress impairment of the flatness of the surface 21. The heat treatment time is more preferably 30 minutes or more and 90 minutes or less, for example.

Next, in the GaN layer formation step S40, the GaN layer 30 is formed by growing GaN on the surface 21 of the AlN layer 20. The HVPE, technique is used as a method for growing the GaN layer 30, for example. Gallium monochloride (GaCl) gas is used as a gallium (Ga) source gas, for example. NH$_3$ gas is used as a nitrogen (N) source gas, for example. These source gases may be mixed with a carrier gas using H$_2$ gas, N$_2$ gas, or a mixed gas thereof, and then be supplied.

The following are examples of conditions for the growth of the GaN layer 30.

Growth temperature: 900 to 1000° C.
VIII ratio: 1 to 1000
Growth speed: 100 to 2000 nm/minute The AlN layer 20 that has high crystallizability as described above and includes the surface 21 reformed as described above is obtained through the AlN layer formation step S20 and the heat treatment step S30. Forming the GaN layer 30 on such an AlN layer 20 in the GaN layer formation step S40 makes it possible to obtain the GaN layer 30 that is of high quality as described above.

The GaN layer 30 is formed at a low temperature of 1000° C. or lower (preferably 950° C. or lower) in the GaN layer formation step S40. This makes it easier to suppress temperature fluctuation in the in-plane direction while growing the GaN layer 30 compared with the case where the GaN layer 30 is formed at a high temperature of higher than 1000° C., thus making it possible to improve the in-plane uniformity of the thickness of the GaN layer 30. It should be noted that, in this embodiment, the AlN layer 20 serving as a base for the growth of the GaN layer 30 has high crystallizability, and therefore, the above-described GaN layer 30 having high crystallizability can be obtained even when the GaN layer 30 is grown at a low temperature of 1000° C. or lower.

The GaN layer 30 may be doped with a dopant as needed while being grown. Temperature fluctuation in the in-plane direction while growing the GaN layer 30 is suppressed, thus making it possible to improve the in-plane uniformity of the dopant concentration in the GaN layer 30. When the GaN layer 30 is doped with a dopant such as an n-type dopant for controlling the carrier concentration, the in-plane uniformity of the carrier concentration in the GaN layer 30 can be improved. It should be noted that a laminated structure in which a portion on the lower layer side (underlying substrate side) of the GaN layer 30 is undoped, and a portion on the upper layer side of the GaN layer 30 is doped with a dopant may also be employed as needed, for example.

In order to improve the crystallizability of the GaN layer 30 as well as the surface flatness of the GaN layer 30, the thickness of the GaN layer 30 is preferably 0.8 μm or more. The upper limit of the thickness of the GaN layer 30 is preferably 10 μm or less from the viewpoint of preventing the wafer 100 from excessively warping.

As described above, the wafer (GaN template) 100 is manufactured. Then, semiconductor elements are manufactured by performing various steps such as a step of forming another group III-nitride layer on the GaN layer 30 and a step of forming an electrode according to the structure of semiconductor elements to be manufactured. Furthermore, the semiconductor elements are divided into individual semiconductor elements.

Second Embodiment

Next, a semiconductor element 200 according to a second embodiment will be described. In the second embodiment, as an example, an aspect is shown in which a group III-nitride laminated substrate 90 (also referred to as a "wafer 90" hereinafter) is manufactured as an AlN template including the AlN layer 20 on the outermost surface and then semiconductor elements 200 are manufactured using the wafer 90.

Figure 3:
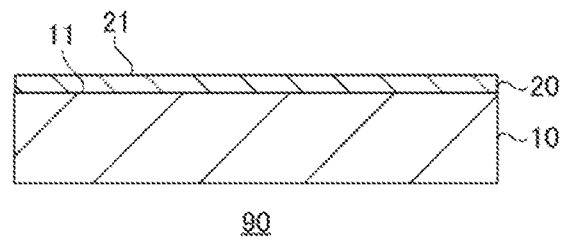
FIG. 3 is an illustrative schematic cross-sectional view of a wafer according to a second embodiment.

FIG. 3 is an illustrative schematic cross-sectional view of the wafer 90. The wafer 90 includes an underlying substrate 10 and an AlN layer 20. The wafer (AlN template) 90 can also be considered as a laminated substrate obtained by performing the process for forming the wafer (GaN template) 100 described in the first embodiment up to the formation of the AlN layer 20.

More specifically, the wafer 90 is a laminated substrate in which the AlN layer 20 has high crystallizability as described above and the surface 21 of the AlN layer 20 is reformed through the above-described heat treatment. Accordingly, the wafer 90 is configured as an AlN template in which the GaN layer 30 that is of high quality as described above can be formed on the AlN layer 20. That is, the wafer 90 is a group III-nitride laminated substrate in which the AlN layer 20 includes the surface 21 to be used as a base for the growth of the GaN layer 30 that has a thickness of 10 μm or less and in which the half-value width of (0002) diffraction determined through X-ray rocking curve analysis is 100 seconds or less, and the half-value width of (10-12) diffraction determined through X-ray rocking curve analysis is 200 seconds or less.

Figure 4:
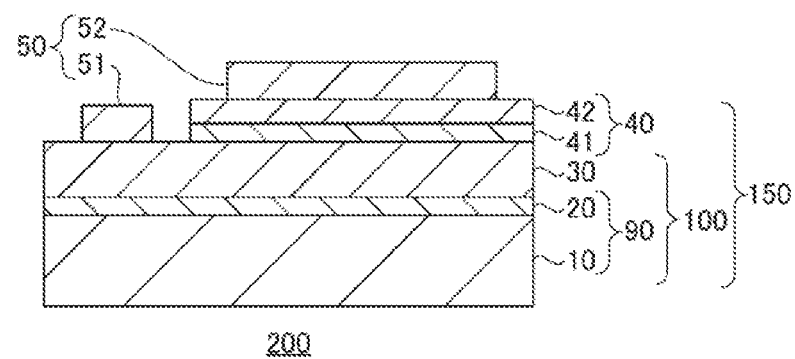
FIG. 4 is a schematic cross-sectional view of a first example of a semiconductor element according to the second embodiment.
Figure 5:
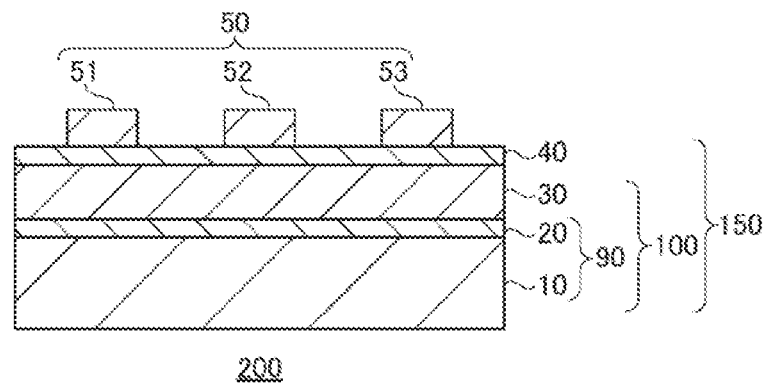
FIG. 5 is a schematic cross-sectional view of a second example of the semiconductor element according to the second embodiment.

FIG. 4 and FIG. 5 are schematic cross-sectional views showing a first example and a second example of the semiconductor element 200 according to the second embodiment, respectively. In order to improve the productivity of the semiconductor elements 200, many semiconductor elements 200 are formed on the wafer 100, and then divided into individual semiconductor elements 200. Both FIG. 4 and FIG. 5 illustrate one divided semiconductor element 200.

A light-emitting diode (LED) is shown as an example of the semiconductor element 200 of the first example. FIG. 4 is a schematic cross-sectional view showing the semiconductor element 200 of the first example (also referred to as an "LED 200" hereinafter). The LED 200 includes an underlying substrate 10, an AlN layer 20, a GaN layer 30 that is an n-type layer doped with an n-type dopant, a light-emitting layer 41 made of a group III-nitride, p-type layer 42 that is made of a group III-nitride and is doped with a p-type dopant, an n-side electrode 51 that is electrically connected to the GaN layer 30, and a p-side electrode 52 that is electrically connected to the p-type layer 42. The light-emitting layer 41 and the p-type layer 42 are collectively referred to as a "group III-nitride layer 40". Moreover, the n-side electrode 51 and the p-side electrode 52 are collectively referred to as an "electrode 50".

The light-emitting layer 41 is configured to have a multiple quantum well structure obtained by alternately stacking indium gallium nitride (InGaN) well layers and GaN barrier layers, for example. The p-type layer 42 is formed by stacking a p-type aluminum nitride (AlGaN) clad layer and a p-type GaN contact layer, for example.

A high electron mobility transistor (HEMT) is shown as an example of the semiconductor element 200 of the second example. FIG. 5 is a schematic cross-sectional view showing the semiconductor element 200 of the second example (also referred to as an "HEMT 200" hereinafter). The HEMT 200 includes an underlying substrate 10, an AlN layer 20, a GaN layer 30 serving as a channel layer, an AlGaN layer 40 serving as a barrier layer, and a source electrode 51, a gate electrode 52, and a drain electrode 53 that are formed on the AlGaN layer 40. The AlGaN layer 40 is also referred to as a "group III-nitride layer 40". Moreover, the source electrode 51, the gate electrode 52, and the drain electrode 53 are collectively referred to as an "electrode 50".

A lower portion of the GaN layer 30 included in the HEMT 200 may be doped with a resistance improving dopant such as iron or carbon in order to improve the withstand voltage.

In both cases of the first example and the second example, the GaN layer 30 included in the semiconductor element 200 is of high quality despite its small thickness (10 μm or less at most). As a result, the following effects are obtained, for example.

The GaN layer 30 included in the semiconductor element 200 has high crystallizability and high surface flatness despite its small thickness. This makes it possible to improve the crystallizability of the group III-nitride layer 40 grown on the GaN layer 30, thus making it possible to improve the performance of the semiconductor element 200.

In both cases of the first example and the second example, the GaN layer 30 included in the semiconductor element 200 has high in-plane thickness uniformity. This makes it possible to suppress the fluctuation in performance between many semiconductor elements 200 formed on the wafer 100.

The GaN layer 30 included in the semiconductor element 200 has high in-plane dopant concentration uniformity when the GaN layer 30 is doped with a dopant, specifically, the GaN layer 30 of the LED 200 of the first example is doped with an n-type dopant, for example, or the GaN layer 30 of the HEMT 200 of the second example is doped with a resistance improving dopant, for example. This makes it possible to suppress the fluctuation in performance between many semiconductor elements 200 formed on the wafer 100.

The GaN layer 30 included in the semiconductor element 200 is of high quality and can thus be used as at least a portion of an operating layer of the semiconductor element 200 in which an operating current flows, specifically, as an n-type layer of the LED 200 of the first example, for example, or as a channel layer of the HEMT 200 of the second example, for example. The GaN layer 30 is of high quality even when doped with a dopant such as an n-type dopant, and can thus be used as an operating layer of the semiconductor element 200.

In both cases of the first example and the second example, the semiconductor elements 200 are formed using a group III-nitride laminated substrate 150 (also referred to as a "wafer 150" hereinafter) obtained by stacking the underlying substrate 10, the AlN layer 20, the GaN layer 30, and the group III-nitride layer 40. In order to suppress defects such as a decrease in precision of lithography caused by warping of the wafer 150 (i.e., warping of the wafer 100) when many semiconductor elements 200 are formed on the wafer 150, it is preferable that the wafer 150 is not excessively warped. The GaN layer 30 included in the semiconductor element 200 of this embodiment has high crystallizability despite its small thickness. Accordingly, warping of the wafer 150 can be suppressed by reducing the thickness of the GaN layer 30, thus making it possible to suppress defects such as a decrease in precision of lithography caused by the warping. That is, it is possible to suppress the fluctuation in performance between many semiconductor elements 200 formed on the wafer 100 (wafer 150).

It should be noted that, in both cases of the LED 200 of the first example and the HEMT 200 of the second example, the structure of the group III-nitride layer 40 formed on the GaN layer 30 and the structure of the electrode 50 may be appropriately changed as needed.

It should be noted that, although an LED and an HEMT are shown as examples of the semiconductor element 200 manufactured using the wafer 90 (i.e., using the wafer 100 or using the wafer 150), other types of semiconductor elements may also be manufactured as needed.

It should be noted that, when an LED and the like are manufactured as the semiconductor element 200 manufactured using the wafer 90 (i.e., manufactured using the wafer 100 or manufactured using the wafer 150), the final element structure may also be a structure in which a support substrate (circuit board) is provided on the upper side of the GaN layer 30 and the underlying substrate 10 (and the AlN layer 20) is removed. Even in such a case, the semiconductor element 200 includes the GaN layer 30 as at least a portion of an operating layer.

Next, a method for manufacturing the semiconductor element 200 will be described. In the second embodiment, an aspect in which the wafer 90 is manufactured as an AlN template including the AlN layer 20 on the outermost surface and then semiconductor elements are manufactured using the wafer (AlN template) 90 is shown as an example.

Figure 6:
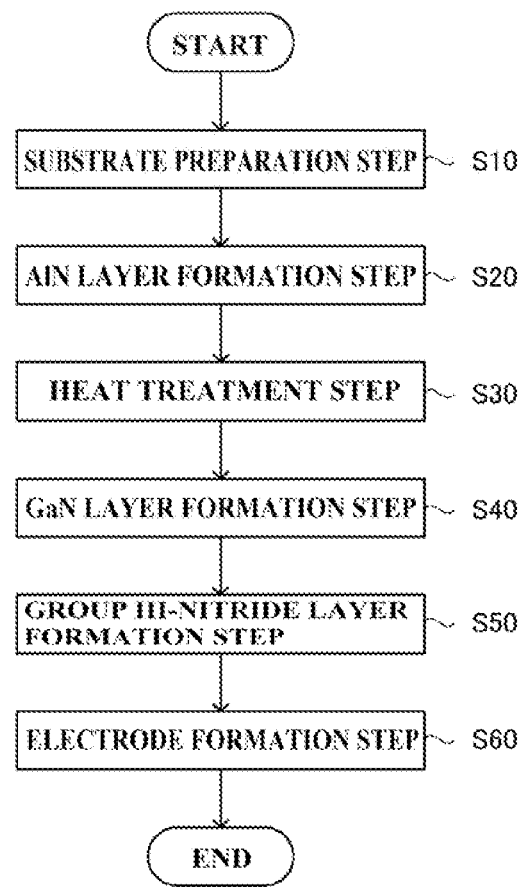
FIG. 6 is a flowchart showing an example of a method for manufacturing a semiconductor element according to the second embodiment.

FIG. 6 is a flowchart showing an example of a method for manufacturing the semiconductor element 200 according to the second embodiment. The manufacturing method of this example includes a substrate preparation step S10, an AlN layer formation step S20, a heat treatment step S30, a GaN layer formation step S40, a group III-nitride layer formation step S50, and an electrode formation step S60.

In the first embodiment, as an example, the aspect is shown in which the wafer 100 serving as a GaN template is manufactured by performing the formation of the AlN layer 20 in the AlN layer formation step S20, the heat treatment in the heat treatment step S30, and the formation of the GaN layer 30 in the GaN layer formation step S40 as a series of crystal growth (e.g., crystal growth using the HVPE technique).

In the second embodiment, as an example, an aspect is shown in which the wafer 90 serving as an AlN template is manufactured by performing the manufacturing process up to the heat treatment in the heat treatment step S30, and then the wafer 150 to be used to manufacture the semiconductor element 200 is manufactured by performing the formation of the GaN layer 30 in the GaN layer formation step S40 and the formation of the group III-nitride layer 40 in the group III-nitride layer formation step S50 as a series of crystal growth (e.g., crystal growth using a metal-organic vapor phase epitaxy (MOVPE) technique). It should be noted that, in the first embodiment, the wafer 100 may also be manufactured by forming the AlN layer 20 using the HVPE technique in the AlN layer formation step S20, for example, and forming the GaN layer 30 using the MOVPE technique in the GaN layer formation step S40, for example.

The substrate preparation step S10, the AlN layer formation step S20, and the heat treatment step S30 are the same as those in the first embodiment. The wafer (AlN template) 90 is manufactured by performing the manufacturing process up to the heat treatment step S30.

Next, in the GaN layer formation step S40, the GaN layer 30 is formed by growing GaN on the AlN layer 20 of the wafer 90. The MOVPE technique is used as a method for growing the GaN layer 30, for example. Trimethylgallium ($Ga(CH_3)_3$, TMG) gas is used as a gallium (Ga) source gas, for example. $NH_3$ gas is used as a nitrogen (N) source gas, for example. These source gases may be mixed with a carrier gas using $H_2$ gas, $N_2$ gas, or a mixed gas thereof, and then be supplied. While being grown, the GaN layer 30 may be doped with a dopant in accordance with the structure of a semiconductor element 200 to be manufactured. A portion of the GaN layer 30 in the thickness direction may be doped with a dopant as needed. As in the first embodiment, the GaN layer 30 that is of high quality can be obtained. In the second embodiment, the wafer 100 as shown in FIG. 1 is obtained as an intermediate structure at the time the GaN layer formation step S40 is finished.

The following are examples of conditions for the growth of the GaN layer 30.

Growth temperature: 900 to 1000° C.
V/III ratio: 500 to 8000
Growth speed: 10 to 100 nm/minute Next, in the group III-nitride layer formation step S50, the group III-nitride layer 40 is formed by growing a group III-nitride on the GaN layer 30. The wafer 150 is thus formed. Forming the group III-nitride layer 40 on the GaN layer 30 that is of high quality makes it possible to improve the quality of the group III-nitride layer 40 and to improve the performance of the semiconductor element 200.

The layer configuration of the group III-nitride layer 40 may be selected as appropriate in accordance with the structure of a semiconductor element 200 to be manufactured. More specifically, the group III-nitride layer 40 includes one or more layers made of a group III-nitride, and each layer included in the group III-nitride layer 40 may contain at least one of aluminum (Al), gallium (Ga), and indium (In), for example, as a group-III element. The compositions of the layers may be selected as appropriate in accordance with the structure of the semiconductor element 200.

The MOVPE technique is used as a method for growing the group III-nitride layer 40, for example. Trimethylaluminum ($Al(CH_3)_3$, TMA) gas is used as an Al source gas, for example. Trimethylgallium ($Ga(CH_3)_3$, TMG) gas is used as a Ga source gas, for example. Trimethylindium ($In(CH_3)_3$, TMG) gas is used as an In source gas, for example. $NH_3$ gas is used as a nitrogen (N) source gas, for example. These source gases may be mixed with a carder gas using $H_2$ gas, $N_2$ gas, or a mixed gas thereof, and then be supplied. The supply amounts of the source gases are adjusted as appropriate in accordance with the compositions of the layers included in the group III-nitride layer 40. While being grown, each layer included in the group III-nitride layer 40 may be doped with a dopant in accordance with the structure of the semiconductor element 200.

Next, in the electrode formation step S60, one or more electrodes 50 are formed according to the structure of the semiconductor element 200. It should be noted that a structure such as a recessed portion may be formed in the wafer 150 in accordance with the structure of the semiconductor element 200 before the electrode 50 is formed. As described above, the semiconductor elements 200 are manufactured. Then, many semiconductor elements 200 formed on the wafer 150 are divided into individual semiconductor elements 200.

EXAMPLES

Next, the results of experiments according to the working example of the present invention will be described. The method described in the first embodiment was used to produce the wafer 100 (also referred to merely as a "wafer" hereinafter) including the underlying substrate 10 (also referred to merely as an "underlying substrate" hereinafter), the AlN layer 20 (also referred to merely as an "AlN layer" hereinafter), and the GaN layer 30 (also referred to merely as a "GaN layer" hereinafter). The wafer was examined regarding how the crystallizability of the GaN layer, the surface flatness of the GaN layer, the in-plane uniformity of the thickness of the GaN layer, the in-plane uniformity of the dopant concentration (carrier concentration) in the GaN layer, and warping of the wafer varied depending on a change in thickness of the GaN layer.

A C-face sapphire substrate having a diameter of 4 inches and a thickness of 900 μm was used as the underlying substrate. The thickness of the AlN layer was set to 0.35 μm. The GaN layer was doped with silicon (Si), which serves as an n-type dopant, at a concentration of $3\times10^{18}$ $cm^{-3}$ (over the entire thickness). The thickness of the GaN layer was changed to 0.4 μm, 0.6 μm, 0.8 μm, 1 μm, 1.2 μm, 1.5 μm, 2 μm, 3 μm, 5 μm, 7 μm, 9 μm, and 10 μm.

Experiments according to a comparative example were also carried out. The comparative example employed a method in which a common GaN buffer layer grown at a low temperature is formed on a sapphire substrate. Specifically, after a sapphire substrate had been placed in an MOVPE apparatus and a gas inside the apparatus had been replaced with nitrogen gas, the temperature of the substrate was set to 1100° C., and then surface cleaning was performed in a hydrogen atmosphere for 10 minutes. Next, the temperature of the substrate was set to a low temperature of 550° C., TMG and ammonia were introduced into the apparatus, and then a GaN buffer layer was grown by 30 nm. Thereafter, the temperature of the substrate was set to 1050° C. while ammonia was fed thereto, and thus a GaN layer 30 similar to those of the working example was grown. The reason why the temperature at which the GaN layer 30 was grown in the comparative example was set to be higher than that in the working example is that it is difficult to form a GaN layer 30 that is of sufficiently high quality by using the method of the comparative example.

Crystallizability of GaN Layer

Figure 12:
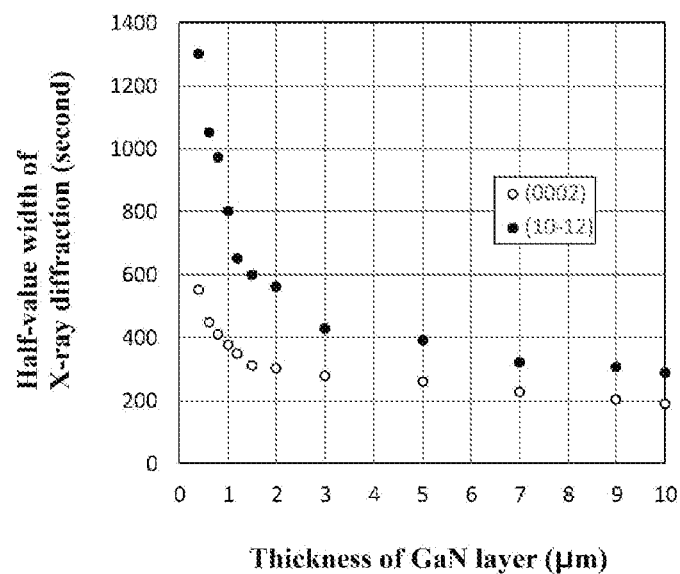
FIG. 12 is a graph showing the crystallizability of GaN layers according to a comparative example.

FIG. 7 is a graph showing the crystallizability of the GaN layers according to the working example, and FIG. 12 is a graph showing the crystallizability of the GaN layers according to the comparative example. In order to evaluate the crystallizability, the half-value width of the (0002) diffraction was measured through X-ray rocking curve analysis, and the half-value width of the (10-12) diffraction was measured through X-ray rocking curve analysis. In FIG. 7 and FIG. 12, the horizontal axis represents the thickness of the GaN layer, and the vertical axis represents the half-value width of X-ray diffraction.

The working example and the comparative example were similar to each other in that the half-value width of X-ray diffraction was likely to decrease as the thickness of the GaN layer was increased, that is, the crystallizability was likely to be improved as the thickness of the GaN layer was increased. However, in the case of the comparative example (FIG. 12), even when the thickness of the GaN layer was increased to 10 μm, the half-value width of the (0002) face was 190 seconds, that is, it was only reduced to about 200 seconds, and the half-value width of the (10-12) face was 290 seconds, that is, it was only reduced to about 300 seconds.

On the contrary, in the case of the working example (FIG. 7), even when the GaN layer had a small thickness of 0.8 μm, the half-value width of the (0002) face was 95 seconds, that is, it was reduced to 100 seconds or less, and the half-value width of the (10-12) face was 190 seconds, that is, it was reduced to 200 seconds or less. In the case of the working example, even when the GaN layer had a thickness of 10 μm or less, increasing the thickness of the GaN layer to 0.8 μm or more made it possible to reduce the half-value width of the (0002) face to 100 seconds or less and the half-value width of the (10-12) face to 200 seconds or less. Furthermore, in the case of the working example, when the thickness of the GaN layer was increased to 10 μm, the half-value width of the (0002) face was 55 seconds, that is, it was reduced to about 50 seconds, and the half-value width of the (10-12) face was 105 seconds, that is, it was reduced to about 100 seconds.

It should be noted that, among the measurement values in the case where the thickness of the GaN layer according to the working example was in a range of 10 μm or less, the minimum value of the half-value width of the (0002) face was 53 seconds obtained from the measurement of the GaN layer having a thickness of 9 μm, and the minimum value of the half-value width of the (10-12) face was 105 seconds obtained from the measurement of the GaN layer having a thickness of 10 μm. When the thickness is in this range, the standard level of the minimum value of the half-value width of the (0002) face is 50 seconds, for example. Moreover, the standard level of the minimum value of the half-value width of the (10-12) face is 100 seconds, for example.

The crystallizability of the GaN layer according to the working example was likely to be significantly improved before the thickness of the GaN layer was increased to about 1.5 μm. When the GaN layer had a thickness of 1 μm, the half-value width of the (0002) face was 76 seconds, that is, it was reduced to 80 seconds or less, and the half-value width of the (10-12) face was 175 seconds, that is, it was reduced to 180 seconds or less. Increasing the thickness of the GaN layer to 1 μm or more made it possible to reduce the half-value width of the (0002) face to 80 seconds or less and the half-value width of the (10-12) face to 180 seconds or less. Moreover, when the GaN layer had a thickness of 1.5 μm, the half-value width of the (0002) face was 68 seconds, that is, it was reduced to 70 seconds or less, and the half-value width of the (10-12) face was 160 seconds, that is, it was reduced to 170 seconds or less. Increasing the thickness of the GaN layer to 1.5 μm or more made it possible to reduce the half-value width of the (0002) face to 70 seconds or less and the half-value width of the (10-12) face to 170 seconds or less.

The GaN layer according to the working example exhibits high crystallizability as described above even when it is doped with a dopant (it is doped with a dopant at a concentration of $1\times10^{16}$ cm$^{-3}$ or more, or $1\times10^{17}$ cm$^{-3}$ or more, or $1\times10^{18}$ cm$^{-3}$ or more, over the entire thickness, for example). Accordingly, it can be said that crystallizability higher than or equal to that in this case is exhibited when the GaN layer is not doped with a dopant. It should be noted that, in order to suppress a decrease in crystallizability, the GaN layer is preferably doped with a dopant at a concentration of $1\times10^{19}$ cm$^{-3}$ or less, for example.

Surface Flatness of GaN Layer

Figure 8:
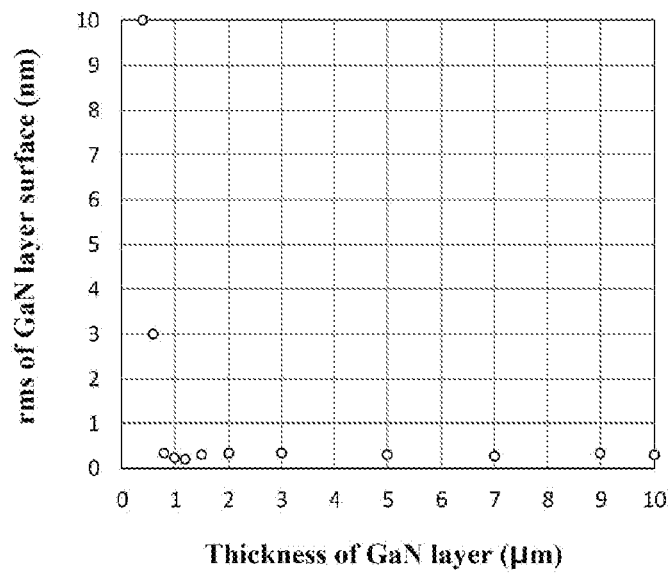
FIG. 8 is a graph showing the surface flatness of the GaN layers according to the working example.
Figure 13:
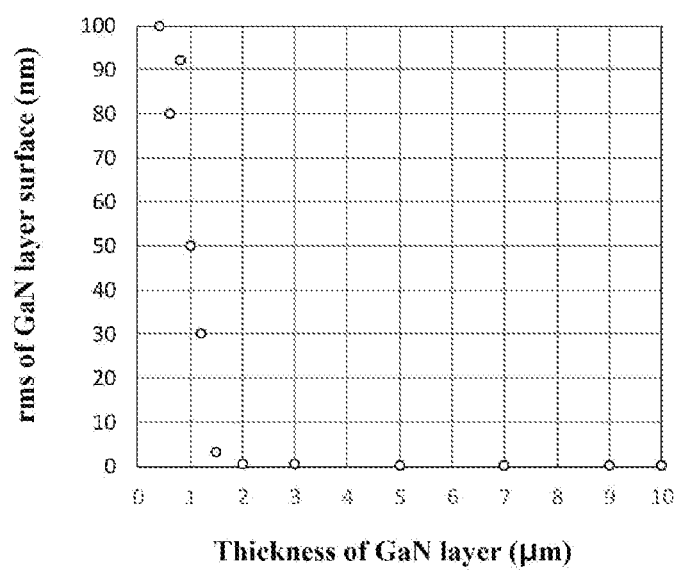
FIG. 13 is a graph showing the surface flatness of the GaN layers according to the comparative example.

FIG. 8 is a graph showing the surface flatness of the GaN layers according to the working example, and FIG. 13 is a graph showing the surface flatness of the GaN layers according to the comparative example. In order to evaluate the surface flatness, an nm value (also referred to merely as an "rms" hereinafter) of the surface roughness of a 5-μm square region on the surface of the GaN layer was determined through a measurement using an AFM. In FIG. 8 and FIG. 13, the horizontal axis represents the thickness of the GaN layer, and the vertical axis represents the rms.

In both cases of the working example and the comparative example, it was likely that the rms sharply decreased before the thickness of the GaN layer was increased to a certain level of thickness, and the rms was substantially constant after the GaN layer had a thickness larger than or equal to that level of thickness. In the case of the comparative example (FIG. 13), although the rms could be reduced to 0.5 nm or less when the GaN layer had a thickness of 2 μm or more, the rms was 3.1 nm when the GaN layer had a thickness of 1.5 μm, and the rms was 92 nm when the GaN layer had a thickness of 0.8 μm.

On the contrary, in the case of the working example (FIG. 8), the rms was 0.33 nm when the GaN layer had a thickness of 0.8 μm, and increasing the thickness of the GaN layer to 0.8 μm or more made it possible to preferably reduce the rms to 0.5 nm or less, and more preferably 0.4 nm or less. The rms was 3 nm when the GaN layer had a thickness of 0.6 μm, and the rms was 10 nm when the GaN layer had a thickness of 0.4 μm.

It should be noted that, among the measurement values in the case where the thickness of the GaN layer according to the working example was in a range of 10 μm or less, the minimum value of the rms was 0.21 nm obtained from the measurement of the GaN layer having a thickness of 1.2 μm. The standard level of the minimum value of the rms is 0.2 nm, for example.

As described above, the GaN layer according to the working example has higher crystallizability and higher surface flatness compared with the GaN layer according to the comparative example and can thus be favorably used as an underlying layer for growing the group III-nitride layer.

In-Plane Uniformity of Thickness of GaN Layer

Figure 9:
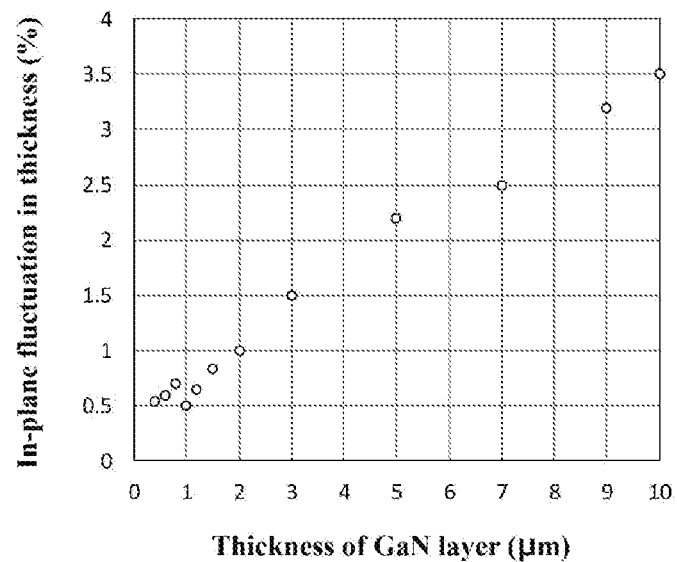
FIG. 9 is a graph showing the in-plane fluctuation in the thicknesses of the GaN layers according to the working example.

FIG. 9 is a graph showing the in-plane fluctuation in the thicknesses of the GaN layers according to the working example. In FIG. 9, the horizontal axis represents the thickness of the GaN layer, and the vertical axis represents the in-plane fluctuation in the thickness. The in-plane fluctuation in the thickness was likely to decrease as the thickness of the GaN layer was reduced. Reducing the thickness of the GaN layer to 10 μm or less made it possible to reduce the in-plane fluctuation in the thickness to 4% or less.

It should be noted, that, among the measurement values in the case where the thickness of the GaN layer according to the working example was in a range of 10 μm or less, the minimum value of the in-plane fluctuation in the thickness of the GaN layer was 0.5% obtained from the measurement of the GaN layer having a thickness of 1 μm. The standard level of the minimum value of the in-plane fluctuation in the thickness of the GaN layer is 0.5% or 0.4%, for example.

In-Plane Uniformity of Dopant Concentration in GaN Layer

Figure 10:
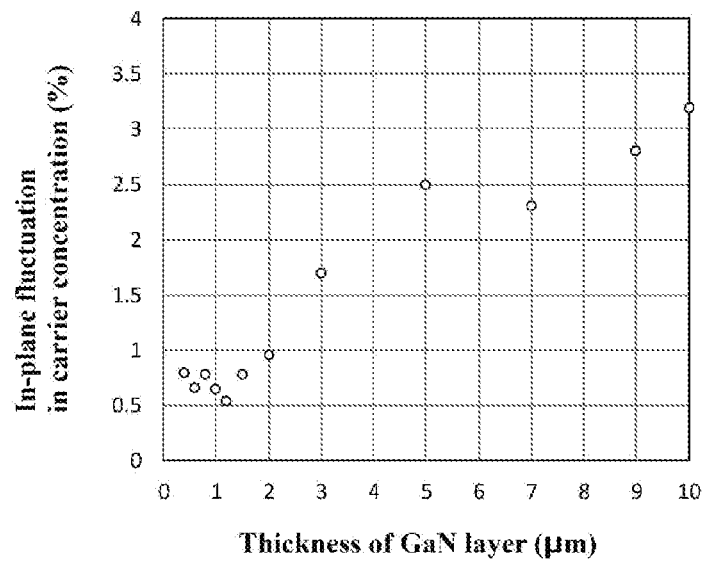
FIG. 10 is a graph showing the in-plane fluctuation in the dopant concentrations (carrier concentrations) in the GaN layers according to the working example.

FIG. 10 is a graph showing the in-plane fluctuation in the dopant concentrations (carrier concentrations) in the GaN layers according to the working example. In this working example, an n-type dopant was used as a dopant with which the GaN layer was doped, and the in-plane fluctuation in the n-type carrier concentration in the GaN layer was measured. The in-plane fluctuation in the n-type carrier concentration in the GaN layer can also be taken as the in-plane fluctuation in the n-type dopant concentration in the GaN layer. In FIG. 10, the horizontal axis represents the thickness of the GaN layer, and the vertical axis represents the fluctuation in the n-type carrier concentration, namely the in-plane fluctuation in the n-type dopant concentration. The in-plane fluctuation in the dopant concentration (carrier concentration) was likely to decrease as the thickness of the GaN layer was reduced. Reducing the thickness of the GaN layer to 10 μm or less made it possible to reduce the in-plane fluctuation in the dopant concentration (carrier concentration) to 4% or less.

It should be noted that, among the measurement values in the case where the thickness of the GaN layer according to the working example was in a range of 10 μm or less, the minimum value of the in-plane fluctuation in the dopant concentration (carrier concentration) was 0.54% obtained from the measurement of the GaN layer having a thickness of 1.2 μm. The standard level of the minimum value of the in-plane fluctuation in the dopant concentration (carrier concentration) in the GaN layer is 0.5% or 0.4%, for example.

Warping of Wafer

FIG. 11 is a graph showing warping of wafers including a GaN layer according to the working example. In FIG. 11, the horizontal axis represents the thickness of the GaN layer, and the vertical axis represents warping of the wafer. The warping of the wafer was likely to decrease as the thickness of the GaN layer was reduced. Reducing the thickness of the GaN layer to 10 μm or less made it possible to preferably reduce the warping of the wafer to 140 μm or less, and more preferably 135 μm or less.

It should be noted that, among the measurement values in the case where the thickness of the GaN layer according to the working example was in a range of 10 μm or less (and 0.8 μm or more), the minimum value of the warping of the wafer was 12 μm obtained from the measurement of the GaN layer having a thickness of 0.8 μm. The standard level of the minimum value of the warping of the wafer is 10 μm, tier example.

The GaN layer according to the working example and the wafer including the GaN layer further have the following characteristics. The crystallizability of the GaN layer was likely to decrease as the thickness of the GaN layer was reduced, whereas the in-plane fluctuation in the thickness of the GaN layer, the in-plane fluctuation in the dopant concentration (carrier concentration) in the GaN layer, and the warping of the wafer could be reduced as the thickness of the GaN layer was reduced (see FIG. 9 to FIG. 11).

For example, reducing the thickness of the GaN layer to 7 μm or less made it possible to preferably reduce the in-plane fluctuation in the thickness of the GaN layer to 3.5% or less, and more preferably 3% or less, preferably reduce the in-plane fluctuation in the dopant concentration (carrier concentration) in the GaN layer to 3.5% or less, and more preferably 3% or less, and preferably reduce the warping of the wafer to 110 μm or less, and more preferably 105 μm or less. It should be noted that, among the measurement values in the case where the thickness of the GaN layer according to the working example was in a range of 7 μm or less, the minimum value of the half-value width of the (0002) face was 55 seconds obtained from the measurement of the GaN layer having a thickness of 3 μm, and the minimum value of the half-value width of the (10-12) face was 112 seconds obtained from the measurement of the GaN layer having a thickness of 7 μm. When the thickness is in this range, the standard level of the minimum value of the half-value width of the (0002) face is 50 seconds, for example. Moreover, the standard level of the minimum value of the half-value width of the (10-12) face is 105 seconds, for example.

Moreover, for example, reducing the thickness of the GaN layer to 5 μm or less made it possible to preferably reduce the in-plane fluctuation in the thickness of the GaN layer to 3% or less, and more preferably 2.5% or less, preferably reduce the in-plane fluctuation in the dopant concentration (carrier concentration) in the GaN layer to 3% or less, and more preferably 2.5% or less, and preferably reduce the warping of the wafer to 80 μm or less, and more preferably 75 μm or less. It should be noted that, among the measurement values in the case where the thickness of the GaN layer according to the working example was in a range of 5 μm or less, the minimum value of the half-value width of the (0002) face was 55 seconds obtained from the measurement of the GaN layer having a thickness of 3 μm, and the minimum value of the half-value width of the (10-12) face was 123 seconds obtained from the measurement of the GaN layer having a thickness of 5 μm. When the thickness is in this range, the standard level of the minimum value of the half-value width of the (0002) face is 50 seconds, for example. Moreover, the standard level of the minimum value of the half-value width of the (10-12) face is 115 seconds, for example.

Moreover, for example, reducing the thickness of the GaN layer to 3 μm or less made it possible to preferably reduce the in-plane fluctuation in the thickness of the GaN layer to 2.5% or less, and more preferably 2% or less, preferably reduce the in-plane fluctuation in the dopant concentration (carrier concentration) in the GaN layer to 2.5% or less, and more preferably 2% or less, and preferably reduce the warping of the wafer to 50 μm or less, and more preferably 45 μm or less. It should be noted that, among the measurement values in the case where the thickness of the GaN layer according to the working example was in a range of 3 μm or less, the minimum value of the half-value width of the (0002) face was 55 seconds obtained from the measurement of the GaN layer having a thickness of 3 μm, and the minimum value of the half-value width of the (10-12) face was 143 seconds obtained from the measurement of the GaN layer having a thickness of 2 μm. When the thickness is in this range, the standard level of the minimum value of the half-value width of the (0002) face is 50 seconds, for example. Moreover, the standard level of the minimum value of the half-value width of the (10-12) face is 135 seconds, for example.

Moreover, for example, reducing the thickness of the GaN layer to 2 μm or less made it possible to preferably reduce the in-plane fluctuation in the thickness of the GaN layer to 2% or less, and more preferably 1.5% or less, preferably reduce the in-plane fluctuation in the dopant concentration (carrier concentration) in the GaN layer to 2% or less, and more preferably 1.5% or less, and preferably reduce the warping of the wafer to 40 μm or less, and more preferably 35 μm or less. It should be noted that, among the measurement values in the case where the thickness of the GaN layer according to the working example was in a range of 2 μm or less, the minimum value of the half-value width of the (0002) face was 62 seconds obtained from the measurement of the GaN layer having a thickness of 2 μm, and the minimum value of the half-value width of the (10-12) face was 143 seconds obtained from the measurement of the GaN layer having a thickness of 2 μm. When the thickness is in this range, the standard level of the minimum value of the half-value width of the (0002) face is 55 seconds, for example. Moreover, the standard level of the minimum value of the half-value width of the (10-12) face is 135 seconds, for example.

Moreover, for example, reducing the thickness of the GaN layer to 1.5 μm or less made it possible to preferably reduce the in-plane fluctuation in the thickness of the GaN layer to 1.5% or less, and more preferably 1% or less, preferably reduce the in-plane fluctuation in the dopant concentration (carrier concentration) in the GaN layer to 1.5% or less, and more preferably 1% or less, and preferably reduce the warping of the wafer to 35 μm or less, and more preferably 30 μm or less. It should be noted that, among the measurement values in the case where the thickness of the GaN layer according to the working example was in a range of 1.5 μm or less, the minimum value of the half-value width of the (0002) face was 68 seconds obtained from the measurement of the GaN layer having a thickness of 1.5 μm, and the minimum value of the half-value width of the (10-12) face was 160 seconds obtained from the measurement of the GaN layer having a thickness of 1.5 μm. When the thickness is in this range, the standard level of the minimum value of the half-value width of the (0002) face is 60 seconds, for example. Moreover, the standard level of the minimum value of the half-value width of the (10-12) face is 155 seconds, for example.

Moreover, for example, reducing the thickness of the GaN layer to 1.2 μm or less made it possible to preferably reduce the in-plane fluctuation in the thickness of the GaN layer to 1% or less, and more preferably 0.8% or less, preferably reduce the in-plane fluctuation in the dopant concentration (carrier concentration) in the GaN layer to 1% or less, and more preferably 0.8% or less, and preferably reduce the warping of the wafer to 30 µm or less, and more preferably 25 µm or less. It should be noted that, among the measurement values in the case where the thickness of the GaN layer according to the working example was in a range of 1.2 µm or less, the minimum value of the half-value width of the (0002) face was 70 seconds obtained from the measurement of the GaN layer having a thickness of 1.2 µm, and the minimum value of the half-value width of the (10-12) face was 166 seconds obtained from the measurement of the GaN layer having a thickness of 1.2 µm. When the thickness is in this range, the standard level of the minimum value of the half-value width of the (0002) face is 65 seconds, for example. Moreover, the standard level of the minimum value of the half-value width of the (10-12) face is 160 seconds, for example.

It should be noted that there is a possibility that the above-described examples of the standard level of the minimum value of the half-value width of the (0002) face, the standard level of the minimum value of the half-value width of the (10-12) face, the standard level of the minimum value of the rms, the standard level of the minimum value of the in-plane fluctuation in the thickness of the GaN layer, the standard level of the minimum value of the in-plane fluctuation in the dopant concentration (carrier concentration) in the GaN layer, and the standard level of the minimum value of the warping of the wafer can be further reduced.

Other Embodiments

The present invention is not limited to the embodiment described above, and it goes without saying that various modifications may be made without departing from the gist of the present invention. Moreover, various embodiments may be combined as appropriate.

For example, although the aspect in which a sapphire substrate is preferably used as the underlying substrate 10 is shown as an example in the embodiments described above, a silicon carbide (SiC) substrate may also be used as the underlying substrate 10, for example. When a GaN layer is formed on the SiC substrate via an AlN layer formed as a nucleation layer, the quality of the GaN layer may be improved by forming an AlN layer having high crystallizability as described above and performing heat treatment as described above on the AlN layer.

Favorable Aspects of the Present Invention

The following are supplementary notes of favorable aspects of the present invention.

Supplementary Note 1

A group III-nitride laminated substrate including:
an underlying substrate (having a diameter of 2 inches or more);
a first layer that is formed on the underlying substrate and is made of aluminum nitride; and
a second layer that is formed on the first layer and is made of gallium nitride,
wherein the second layer has a thickness of 10 µm or less, a half-value width of (0002) diffraction determined through X-ray rocking curve analysis is 100 seconds or less, and a half-value width of (10-12) diffraction determined through X-ray rocking curve analysis is 200 seconds or less.

Supplementary Note 2

The group III-nitride laminated substrate according to Supplementary Note 1, wherein the second layer has a thickness of 0.8 µm or more.

Supplementary Note 3

The group III-nitride laminated substrate according to Supplementary Note 1 or 2, wherein, when a root mean square value determined through measurement of a 5-µm square region using an atomic force microscope is taken as a surface roughness, the surface of the second layer has a surface roughness of 0.5 nm or less (more preferably 0.4 nm or less).

Supplementary Note 4

The group III-nitride laminated substrate according to any one of Supplementary Notes 1 to 3, wherein in-plane fluctuation in the thickness of the second layer is 4% or less.

Supplementary Note 5

The group III-nitride laminated substrate according to any one of Supplementary Notes 1 to 4, wherein the second layer is doped with a dopant, and in-plane fluctuation in a dopant concentration in the second layer is 4% or less.

Supplementary Note 6

The group III-nitride laminated substrate according to any one of Supplementary Notes 1 to 5, wherein the second layer is doped with a dopant for controlling a carrier concentration (n-type dopant), and in-plane fluctuation in the carrier concentration (n-type carrier concentration) in the second layer is 4% or less.

Supplementary Note 7

The group III-nitride laminated substrate according to any one of Supplementary Notes 1 to 6, wherein warping of the group III-nitride laminated substrate is 140 µm or less (more preferably 135 µm or less).

Supplementary Note 8

The group III-nitride laminated substrate according to any one of Supplementary Notes 1 to 7, wherein the second layer has a thickness of 7 µm or less.

Supplementary Note 9

The group III-nitride laminated substrate according to Supplementary Note 8, wherein in-plane fluctuation in the thickness of the second layer is 3.5% or less (more preferably 3% or less).

Supplementary Note 10

The group III-nitride laminated substrate according to Supplementary Note 8 or 9, wherein the second layer is doped with a dopant (dopant for controlling a carrier concentration), and in-plane fluctuation in a dopant concentration (carrier concentration) in the second layer is 3.5% or less (more preferably 3% or less).

Supplementary Note 11

The group III-nitride laminated substrate according to any one of Supplementary Notes 8 to 10, wherein warping of the group III-nitride laminated substrate is 110 µm or less (more preferably 105 µm or less).

Supplementary Note 12

The group III-nitride laminated substrate according to any one of Supplementary Notes 1 to 11, wherein the second layer has a thickness of 5 µm or less.

Supplementary Note 13

The group III-nitride laminated substrate according to Supplementary Note 12, wherein in-plane fluctuation in the thickness of the second layer is 3% or less (more preferably 2.5% or less).

Supplementary Note 14

The group III-nitride laminated substrate according to Supplementary Note 12 or 13, Wherein the second layer is doped with a dopant (dopant for controlling a carrier concentration), and in-plane fluctuation in a dopant concentration (carrier concentration) in the second layer is 3% or less (more preferably 2.5% or less).

Supplementary Note 15
The group III-nitride laminated substrate according to any one of Supplementary Notes 12 to 14, wherein warping of the group III-nitride laminated substrate is 80 μm or less (more preferably 75 μm or less).
Supplementary Note 16
The group III-nitride laminated substrate according to any one of Supplementary Notes 1 to 1.5, wherein the second layer has a thickness of 3 μm or less.
Supplementary Note 17
The group III-nitride laminated substrate according to Supplementary Note 16, Wherein in-plane fluctuation in the thickness of the second layer is 2.5% or less (more preferably 2% or less).
Supplementary Note 18
The group III-nitride laminated substrate according to Supplementary Note 16 or 17, wherein the second layer is doped with a dopant (dopant for controlling a carrier concentration), and in-plane fluctuation in a dopant concentration (carrier concentration) in the second layer is 2.5% or less (more preferably 2% or less).
Supplementary Note 19
The group III-nitride laminated substrate according to any one of Supplementary Notes 16 to 18, wherein warping of the group III-nitride laminated substrate is 50 μm or less (more preferably 45 μm or less).
Supplementary Note 20
The group III-nitride laminated substrate according to any one of Supplementary Notes 1 to 19, wherein the second layer has a thickness of 2 μm or less.
Supplementary Note 21
The group III-nitride laminated substrate according to Supplementary Note 20, wherein in-plane fluctuation in the thickness of the second layer is 2% or less (more preferably 1.5% or less).
Supplementary Note 22
The group III-nitride laminated substrate according to Supplementary Note 20 or 21, wherein the second layer is doped with a dopant (dopant for controlling a carrier concentration), and in-plane fluctuation in a dopant concentration (carrier concentration) in the second layer is 2% or less (more preferably 1.5% or less).
Supplementary Note 23
The group III-nitride laminated substrate according to any one of Supplementary Notes 20 to 22, wherein warping of the group III-nitride laminated substrate is 40 μm or less (more preferably 35 μm or less).
Supplementary Note 24
The group III-nitride laminated substrate according to any one of Supplementary Notes 1 to 23, wherein the second layer has a thickness of 1.5 μm or less.
Supplementary Note 25
The group III-nitride laminated substrate according to Supplementary Note 24, wherein in-plane fluctuation in the thickness of the second layer is 1.5% or less (more preferably 1% or less).
Supplementary Note 26
The group III-nitride laminated substrate according to Supplementary Note 24 or 25, wherein the second layer is doped with a dopant (dopant for controlling a carrier concentration), and in-plane fluctuation in a dopant concentration (carrier concentration) in the second layer is 1.5% or less (more preferably 1% or less).
Supplementary Note 27
The group III-nitride laminated substrate according to any one of Supplementary Notes 24 to 26, wherein warping of the group III-nitride laminated substrate is 35 μm or less (more preferably 30 μm or less).
Supplementary Note 28
The group III-nitride laminated substrate according to any one of Supplementary Notes 1 to 27, wherein the second layer has a thickness of 1.2 μm or less.
Supplementary Note 29
The group III-nitride laminated substrate according to Supplementary Note 28, wherein in-plane fluctuation in the thickness of the second layer is 1% or less (more preferably 0.8% or less).
Supplementary Note 30
The group III-nitride laminated substrate according to Supplementary Note 28 or 29, wherein the second layer is doped with a dopant (dopant for controlling a carrier concentration), and in-plane fluctuation in a dopant concentration (carrier concentration) in the second layer is 1% or less (more preferably 0.8% or less).
Supplementary Note 31
The group III-nitride laminated substrate according to any one of Supplementary Notes 28 to 30, wherein warping of the group III-nitride laminated substrate is 30 μm or less (more preferably 25 μm or less).
Supplementary Note 32
The group III-nitride laminated substrate according to any one of Supplementary Notes 1 to 31, wherein the second layer has a thickness of 1 μm or more, the half-value width of (0002) diffraction determined through X-ray rocking curve analysis is 80 seconds or less, and the half-value width of (10-12) diffraction determined through X-ray rocking curve analysis is 180 seconds or less.
Supplementary Note 33
The group III-nitride laminated substrate according to any one of Supplementary Notes 1 to 27, wherein the second layer has a thickness of 1.5 μm or more, the half-value width of (0002) diffraction determined through X-ray rocking curve analysis is 70 seconds or less, and the half-value width of (10-12) diffraction determined through X-ray rocking curve analysis is 170 seconds or less.
Supplementary Note 34
The group III-nitride laminated substrate according to any one of Supplementary Notes 1 to 33, wherein the underlying substrate is a sapphire substrate. The sapphire substrate preferably has a diameter of 2 inches and a thickness of 300 μm or more and 500 μm or less, a diameter of 4 inches and a thickness of 600 μm or more and 1000 μm or less, or a diameter of 6 inches and a thickness of 1000 μm or more and 1500 μm or less, for example.
Supplementary Note 35
The group III-nitride laminated substrate according to any one of Supplementary Notes 1 to 34, which is to be used to manufacture a semiconductor element, wherein the second layer is to be used as at least a portion of an operating layer of the semiconductor element.
Supplementary Note 36
A semiconductor element, wherein the second layer included in the group III-nitride laminated substrate according to any one of Supplementary Notes 1 to 35 is used as at least a portion of an operating layer.
Supplementary Note 37
A group III-nitride laminated substrate including:
an underlying substrate (having a diameter of 2 inches or more); and
a first layer that is formed on the underlying substrate and is made of aluminum nitride,
wherein a surface of the first layer is to be used as a base for growth of a second layer that is made of gallium nitride and has a thickness of 10 μm or less and in which a half-value width of (0002) diffraction determined through X-ray rocking curve analysis is 100 seconds or less, and a half-value width of (10-12) diffraction determined through X-ray rocking curve analysis is 200 seconds or less. It is preferable that a surface of the first layer is to be used as a base for growth of the second layer according to any one of Supplementary Notes 2 to 33.

LIST OF REFERENCE NUMERALS

10 . . . underlying substrate, 11 . . . principal surface (of underlying substrate), 20 . . . AlN layer, 21 . . . surface (of AlN layer), 30 . . . GaN layer, 31 . . . surface (of GaN layer), 40 . . . group III-nitride layer, 41 . . . light-emitting layer, 42 . . . p-type layer, 50 . . . electrode, 90 . . . group III-nitride laminated substrate, 100 . . . group III-nitride laminated substrate, 150 . . . group III-nitride laminated substrate, 200 . . . semiconductor element

What is claimed is:

1. A group III-nitride laminated substrate comprising:
   an underlying substrate;
   a first layer that is formed on the underlying substrate, wherein the first layer consists of aluminum nitride, with a top surface having Al-polarity; and
   a second layer that is formed on the top surface of the first layer and is made of gallium nitride,
   wherein the second layer has a thickness of 10 μm or less, a half-value width of (0002) diffraction determined through X-ray rocking curve analysis is 100 seconds or less, and a half-value width of (10-12) diffraction determined through X-ray rocking curve analysis is 200 seconds or less.

2. The group III-nitride laminated substrate according to claim 1, wherein, when a root mean square value determined through measurement of a 5-μm square region using an atomic force microscope is taken as a surface roughness, the surface of the second layer has a surface roughness of 0.5 nm or less.

3. The group III-nitride laminated substrate according to claim 1, wherein in-plane fluctuation in the thickness of the second layer is 4% or less.

4. The group III-nitride laminated substrate according to claim 1, wherein the second layer is doped with a dopant, and in-plane fluctuation in a dopant concentration in the second layer is 4% or less.

5. The group III-nitride laminated substrate according to claim 1, wherein the second layer is doped with a dopant for controlling a carrier concentration, and in-plane fluctuation in the carrier concentration in the second layer is 4% or less.

6. The group III-nitride laminated substrate according to claim 1, wherein warping of the group III-nitride laminated substrate is 140 μm or less.

7. The group III-nitride laminated substrate according to claim 1, wherein the second layer has a thickness of 3 μm or less.

8. The group III-nitride laminated substrate according to claim 7, wherein in-plane fluctuation in the thickness of the second layer is 2.5% or less.

9. The group III-nitride laminated substrate according to claim 7, wherein the second layer is doped with a dopant, and in-plane fluctuation in a dopant concentration in the second layer is 2.5% or less.

10. The group III-nitride laminated substrate according to claim 7, wherein warping of the group III-nitride laminated substrate is 50 μm or less.

11. The group III-nitride laminated substrate according to claim 1, which is to be used to manufacture a semiconductor element, wherein the second layer is to be used as at least a portion of an operating layer of the semiconductor element.

12. A semiconductor element comprising, as at least a portion of an operating layer, a second layer included in a group III-nitride laminated substrate, the group III-nitride laminated substrate including:
    an underlying substrate;
    a first layer that is formed on the underlying substrate, wherein the first layer consists of aluminum nitride, with a top surface having Al-polarity; and
    a second layer that is formed on the top surface of the first layer and is made of gallium nitride,
    wherein the second layer has a thickness of 10 μm or less, a half-value width of (0002) diffraction determined through X-ray rocking curve analysis is 100 seconds or less, and a half-value width of (10-12) diffraction determined through X-ray rocking curve analysis is 200 seconds or less.

13. A group III-nitride laminated substrate comprising:
    an underlying substrate; and
    a first layer that is formed on the underlying substrate, wherein the first layer consists of aluminum nitride, with a top surface having Al-polarity,
    wherein the top surface of the first layer is to be used as a base for growth of a second layer that is made of gallium nitride and has a thickness of 10 μm or less and in which a half-value width of (0002) diffraction determined through X-ray rocking curve analysis is 100 seconds or less, and a half-value width of (10-12) diffraction determined through X-ray rocking curve analysis is 200 seconds or less.

* * * * *